US012776356B2

(12) United States Patent
Kim et al.

(10) Patent No.: US 12,776,356 B2
(45) Date of Patent: Oct. 27, 2026

(54) VCMA MRAM DEVICE

(71) Applicants: IMEC VZW, Leuven (BE); Katholieke Universiteit Leuven, KU LEUVEN R&D, Leuven (BE)

(72) Inventors: Woojin Kim, Watermael-Boitsfort (BE); Robert Carpenter, Kessel-Lo (BE); Maxwel Gama Monteiro Junior, Leuven (BE)

(73) Assignees: Imec vzw, Leuven (BE); Katholieke Universiteit Leuven, Leuven (BE)

( * ) Notice: Subject to any disclaimer, the term of this patent is extended or adjusted under 35 U.S.C. 154(b) by 118 days.

(21) Appl. No.: 18/988,244

(22) Filed: Dec. 19, 2024

(65) Prior Publication Data

US 2025/0210082 A1 Jun. 26, 2025

(30) Foreign Application Priority Data

Dec. 22, 2023 (EP) .................................... 23219705

(51) Int. Cl.

| | |
|---|---|
| ***G11C 11/16*** | (2006.01) |
| ***H10N 50/10*** | (2023.01) |
| ***H10N 50/85*** | (2023.01) |

(52) U.S. Cl.

CPC ........ *G11C 11/161* (2013.01); *G11C 11/1673* (2013.01); *G11C 11/1675* (2013.01); *H10N 50/10* (2023.02); *H10N 50/85* (2023.02)

(58) Field of Classification Search

CPC .............. G11C 11/161; G11C 11/1673; G11C 11/1675; H10B 61/00

See application file for complete search history.

(56) References Cited

U.S. PATENT DOCUMENTS

| | | | | |
|---|---|---|---|---|
| 9,324,403 | B2 | 4/2016 | Amiri et al. | |
| 9,450,020 | B2 | 9/2016 | Amiri | |
| 2019/0207096 | A1* | 7/2019 | Pinarbasi | H10N 50/80 |
| 2021/0210676 | A1* | 7/2021 | Prasad | G11C 11/161 |

(Continued)

OTHER PUBLICATIONS

Extended European Search Report for European Application No. 23219705.3, mailed Jun. 10, 2024.

(Continued)

*Primary Examiner* — Han Yang

(74) *Attorney, Agent, or Firm* — McDonnell Boehnen Hulbert & Berghoff LLP

(57) ABSTRACT

A memory stack for a VCMA-MRAM device includes a magnetic tunnel junction (MTJ) layer structure, an auxiliary magnetic layer structure including a second hard magnetic layer and an auxiliary magnetic layer, and an interposer layer structure interposing a free layer of the MTJ layer structure and the auxiliary magnetic layer of the auxiliary magnetic layer structure. The interposer layer structure includes a second barrier layer configured to induce a VCMA in the auxiliary magnetic layer and a non-magnetic spacer layer interposing the second barrier layer and the free layer. In response to a first bias voltage exceeding a first threshold voltage across the memory stack, the VCMA induced in the auxiliary magnetic layer causes the auxiliary magnetic layer to be destabilized from a pinned magnetization state with a magnetization oriented along the first direction, and brought to a destabilized magnetization state.

20 Claims, 4 Drawing Sheets

(56) References Cited

U.S. PATENT DOCUMENTS

| | | | |
|---|---|---|---|
| 2021/0390997 A1 | 12/2021 | Kim et al. |
| 2022/0278270 A1 | 9/2022 | Guo et al. |

OTHER PUBLICATIONS

Sin, S., Oh, S. Deterministic field-free voltage-induced magnetization switching with self-regulated precession for low-power memory. Sci Rep 13, 16084 (2023). https://doi.org/10.1038/s41598-023-43378-2.

Y. C. Wu et al., "Deterministic and Field-Free Voltage-Controlled MRAM for High Performance and Low Power Applications," 2020 IEEE Symposium on VLSI Technology, Honolulu, HI, USA, 2020, pp. 1-2, doi: 10.1109/VLSITechnology18217.2020.9265057.

R. Carpenter et al., "Offset Field Control for VCMA-MRAM," in IEEE Transactions on Nanotechnology, vol. 22, pp. 564-568, 2023, doi: 10.1109/TNANO.2023.3312949.

R. Carpenter et al., "Demonstration of a Free-layer Developed With Atomistic Simulations Enabling BEOL Compatible VCMA-MRAM with a Coefficient ≥100fJ/Vm," 2021 IEEE International Electron Devices Meeting (IEDM), San Francisco, CA, USA, 2021, pp. 17.6.1-17.6.4, doi: 10.1109/IEDM19574.2021.9720579.

T. Yamamoto, et al., "Developments in voltage-controlled subnanosecond magnetization switching," Journal of Magnetism and Magnetic Materials, vol. 560, Oct. 15, 2022, 169637.

T. Yamamoto, et al., "Improvement of write error rate in voltage-driven magnetization switching," Journal of Physics D: Applied Physics, vol. 52, No. 16, doi: 10.1088/1361-6463/ab03c2.

* cited by examiner

VCMA MRAM DEVICE

CROSS-REFERENCE TO RELATED APPLICATIONS

The present application is a non-provisional patent application claiming priority to European application no. 23219705.3, filed on Dec. 22, 2023, the contents of which are hereby incorporated by reference.

FIELD OF THE DISCLOSURE

The present disclosure generally relates to a memory stack for a voltage-controlled magnetic anisotropy (VCMA) magnetic random access memory (MRAM) device and to a method for programming a VCMA MRAM device.

BACKGROUND

Magnetic random access memory (MRAM) is a promising memory technology providing non-volatile data storage, high write and read speeds, and low power consumption. The non-volatile storage function of an MRAM device is provided by a magnetic tunnel junction (MTJ) device. A magnetic tunnel junction structure may include a free layer, a barrier layer (typically an oxide), a reference layer, and a hard magnetic layer. A magnetization state of the reference layer is fixed or pinned by the hard magnetic layer. The orientation of the magnetization of the free layer may be switched in relation to the (fixed) orientation of the magnetization of the reference layer between a first orientation where the magnetization orientation of the free layer is aligned with the magnetization orientation of the reference layer, and a second orientation where the magnetization orientation of the free layer is against the magnetization orientation of the reference layer. The first and second orientations may be referred to as the parallel magnetization orientation or state P and the anti-parallel magnetization orientation or state AP, respectively. The relative orientations of the magnetization of the reference layer and the free layer determines a resistance to current of the MTJ device, wherein the P orientation or P state may correspond to the lower resistance state (LRS) and the AP orientation or AP state corresponds to the higher resistance state (HRS). The tunnel magneto-resistance ratio (TMR) is a measure of the difference in the MTJ electrical resistance between the AP state and the P state. Accordingly, by measuring the resistance of the MTJ the magnetization state of the free layer may be sensed.

Current MRAM technology typically relies on spin-transfer-torque (STT) as the key switching mechanism of the free layer magnetization. However, STT writing may require a substantial amount of spin-polarized currents flowing through the oxide barrier of a magnetic tunnel junction (MTJ), which may limit the power efficiency of the writing operation. Intense tunneling current can also degrade the tunnel barrier of the MTJs and thus affect the reliability of the memory cells.

Voltage-controlled magnetic anisotropy (VCMA) is another method that enables ultra-low power writing operations. In contrast to STT-aided free layer switching, VCMA employs a bias voltage applied across the MTJ device to induce a voltage across the barrier layer. This creates an electric field within the tunnel layer which may modify the charge distribution of the local interface between the barrier layer and the free layer. The changed charge distribution results in an observable modulation of the magnetic anisotropy of the free layer, lowering the energy barrier between the P and AP states and thus enabling the initially stable device to be more easily switched by means of an external magnetic field. The amount of modulation depends on the quality of the MTJ materials and interfaces and is quantified by the VCMA coefficient (in units of fJ/V·m).

A VCMA-aided writing scheme, although clearly a low power solution, is however associated with a number of challenges.

Firstly, current proof-of-concept writing schemes are typically based on a precession of the free layer magnetization and hence allows switching of the MTJ between the AP and P states without any current flow through the device. The precession requires an external magnetic field orthogonal to the magnetization orientation of the free layer (e.g. in-plane in case of a free layer with perpendicular magnetic anisotropy (PMA)). The external magnetic field needs to be synchronized with the (pulsed) bias voltage.

Secondly, the precession-based writing scheme requires high frequency voltage pulses and very precise timing control to operate with sufficiently low write error rates. The voltage pulse should be short and within very tight tolerances for reliable switching, as the switching precession depends heavily on the pulse width. For example, a typical median duration of a voltage pulse may be 1 ns with a +/−0.2 ns tolerance. Any longer or shorter pulse duration can result in significant decrease in switching success, leading to large Write-Error Rate (WER).

Thirdly, the conventional VCMA write is a sequential read-write operation. Because both anti-parallel (AP) and parallel (P) states are equally stable, the AP-P and P-AP transitions share the same polarity write pulse. Hence to ensure a desired final state, a pre-read is required to decide if writing is needed. For example, to write LRS, the write pulse should only be applied to HRS MTJ devices. This is because an MTJ device already in the LRS will switch to HRS in response to the write pulse, and vice versa. Consequently, the entire write process of "read+evaluate+write" may reduce the time-efficiency and power-efficiency promised by VCMA writing.

SUMMARY

It is a potential benefit of the present disclosure to provide a memory stack that allows a deterministic VCMA-aided free layer switching protocol mitigating the need for a pre-read, to thereby enable an VCMA-MRAM device with one or more of a reduced-complexity, improved power efficiency, or improved speed.

Hence, according to a first aspect, there is provided a memory stack for a voltage-controlled magnetic anisotropy (VCMA) magnetic random access memory (MRAM) device, the memory stack comprising:

- an MTJ layer structure comprising a first hard magnetic layer, a reference layer with a magnetization state pinned by the first hard magnetic layer, a free layer switchable between a first magnetization state with a magnetization oriented along a first direction and a second magnetization state with a magnetization oriented along a second direction opposite the first direction, and a first barrier layer interposing the reference layer and the free layer and configured to induce a VCMA in the free layer;
- an auxiliary magnetic layer structure comprising a second hard magnetic layer and an auxiliary magnetic layer; and an interposer layer structure interposing the free layer of the MTJ layer structure and the auxiliary magnetic layer of the auxiliary magnetic layer structure and comprising a second barrier layer configured to induce a VCMA in the auxiliary magnetic layer, and a non-magnetic spacer layer interposing the second barrier layer and the free layer;

wherein, in absence of a bias voltage across the memory stack, a magnetization state of the auxiliary magnetic layer is pinned by the second hard magnetic layer of the auxiliary magnetic layer structure in a pinned magnetization state with a magnetization oriented along the first direction;

wherein, in response to a first bias voltage exceeding a first threshold voltage across the memory stack, the VCMA induced in the auxiliary magnetic layer causes the auxiliary magnetic layer to be destabilized from the pinned magnetization state and brought to a destabilized magnetization state;

wherein the free layer is arranged in an offset field generated by the memory stack and wherein the auxiliary magnetic layer is configured to:

when the auxiliary magnetic layer is in the pinned magnetization state, provide a first contribution to the offset field such that the offset field is oriented along the first direction at the free layer, and, when the auxiliary magnetic layer is in the destabilized magnetization state, provide a second contribution to the offset field such that the offset field is oriented along the second direction at the free layer; and wherein the first threshold voltage exceeds a second threshold voltage for causing VCMA-induced switching of the free layer from the second magnetization state to the first magnetization state.

According to a second aspect there is provided an MRAM device comprising a memory stack according to the first aspect, or any embodiments or variations thereof, and further comprising a program circuit configured to apply the first bias voltage to set the free layer to the second magnetization state, and to apply a second bias voltage between the first and second threshold voltages to set the free layer to the first magnetization state.

According to a third aspect there is provided a method for programming a memory stack of an MRAM device according to the second aspect or any embodiments or variations thereof, the method comprising:

setting the free layer to the first magnetization state by applying a bias voltage between the first and second threshold voltages to the memory stack; or setting the free layer to the second magnetization state by applying a bias voltage exceeding the first threshold voltage to the memory stack.

Thus, the present disclosure is based on the realization that an auxiliary magnetic layer structure comprising a pinned auxiliary magnetic layer with VCMA can be used to modulate the (magnetostatic) offset field (interchangeably "stray field") at the free layer such that the sign of the offset field may be varied. The orientation of the free layer magnetization may thus be coupled to the offset field, such that the offset field (whose orientation depends on the amplitude of the bias voltage across the memory stack) may act to orient the magnetization orientation of the free layer to align with the offset field during switching.

As a result, the conventionally used precession-inducing external field is no longer required because this function is now provided by the auxiliary magnetic layer structure and the modulation of the stray field direction.

Moreover, the pulse width dependence of the conventional VCMA write schemes is removed since the offset field may provide a precise tilting or biasing of the layer magnetization towards the first or second free layer directions and the corresponding free layer magnetization states. The tilting is determined by the intrinsic stray fields generated by the auxiliary magnetic layer structure (i.e. the second hard magnetic layer and the auxiliary magnetic layer) and its superposition with stray field generated by the other magnetic layer of the memory stack (e.g., the first hard magnetic layer and the reference layer). Therefore, regardless of the time during which the bias voltage is applied, as long as it is sufficient to enable the tilting of the free layer towards the intended final state, the free layer magnetization will predictably undergo precession in a direction determined in principle only by pulse amplitude. This may considerably facilitate memory circuit design and reduce variability factors.

Since the tilting of the free layer magnetization is determined mostly by voltage amplitude, deterministic switching of the free layer magnetization is enabled using a single polarity write voltage and without requiring a pre-read to determine the magnetization state of the free layer prior to writing. That is, regardless of the current state of the free layer, a bias voltage exceeding the second threshold voltage and being less than the first threshold voltage will deterministically set the free layer in the first magnetization state (with the magnetization oriented in the first direction), while a bias voltage exceeding the second threshold voltage will deterministically set the free layer in the second magnetization state (with the magnetization oriented in the second direction). That is, the free layer magnetization will either be tilted towards the opposite state or simply return to a tilting which favors the same state as before. In other words, the final magnetization state of the free layer will depend on whether the amplitude of the applied bias voltage is sufficient to bring the auxiliary magnetic layer to the destabilized magnetization state such that the sign of the offset field is flipped.

The VCMA in the auxiliary magnetic layer is enabled by the second barrier layer of the interposer layer structure. Meanwhile, the non-magnetic spacer layer interposing the second barrier layer and the free layer may counteract or prevent the second barrier layer from inducing VCMA in the free layer at the free layer interface opposite the interface toward the first barrier layer. The non-magnetic spacer layer may thus act as a VCMA-breaking layer between the free layer and the second barrier layer.

A first threshold voltage (for changing the auxiliary magnetic layer to the destabilized magnetization state) exceeding a second threshold voltage (for bringing the free layer from the second to first magnetization state) may be achieved for instance by configuring the memory stack such that the VCMA-coefficient of the auxiliary magnetic layer is smaller than the VCMA-coefficient of the free layer, and/or such that the auxiliary magnetic layer has a stronger magnetic anisotropy than the free layer.

As used herein, the term "magnetization" of a layer is can refer to the net magnetization of the layer, i.e. equivalent to the sum of the elementary magnetic moments of the layer.

The "orientation" of a magnetization of a layer (e.g., the free layer or the auxiliary magnetic layer) can refer to the orientation of the magnetization vector of the layer, or equivalently the orientation of the net magnetic moment of the layer. That a magnetization of a layer is oriented along a given direction (e.g., the first direction or the second direction) means that a component (typically a major component) of the magnetization (i.e., of the magnetization vector) is parallel to the given direction. Conversely, that a magnetization of a layer is oriented against or opposite a given direction (e.g., the first direction or the second direction) means that a component (typically a major component) of the magnetization (i.e., of the magnetization vector) is anti-parallel to the given direction.

The free layer is a layer having a magnetization which may be switched between first and second magnetization states. The first magnetization state corresponds to the free layer magnetization being oriented in the first direction. The second magnetization state corresponds to the free layer magnetization being oriented in the opposite second direction. The first magnetization state and the second magnetization state may correspond to an anti-parallel (AP) state and a parallel (P) state, respectively, of the MTJ layer structure, in implementations of the memory stack where the magnetization of the reference layer is oriented along the first direction. The first magnetization state and the second magnetization state may alternatively correspond to a P state and an AP state, respectively, of the MTJ layer structure, in implementations of the memory stack wherein the magnetization of the reference layer is oriented along the second direction.

The first hard magnetic layer, the reference layer, the free layer, the auxiliary magnetic layer, and the second hard magnetic layer may each be layers with perpendicular magnetic anisotropy (PMA). The first and second directions may accordingly be mutually opposite out-of-plane directions with respect to the free layer, i.e., transverse to the in-plane direction of the free layer.

The first hard magnetic layer, the reference layer, the free layer, the auxiliary magnetic layer, and the second hard magnetic layer may alternatively each be layers with in-plane magnetic anisotropy (IPMA). The first and second directions may accordingly be mutually opposite in-plane directions with respect to the free layer.

In some embodiments, the destabilized magnetization state of the auxiliary magnetic layer corresponds to a magnetization of the auxiliary magnetic layer being oriented transverse to the first direction. The VCMA-effect induced by the second barrier layer may hence, in response to the first bias voltage, module the magnetic anisotropy of the auxiliary magnetic layer such that the magnetization vector is rotated from an out-of-plane orientation to an in-plane orientation (in implementations where the auxiliary magnetic layer presents PMA), or from an in-plane orientation to an out-of-plane orientation (in implementations where the auxiliary magnetic layer presents PMA). The contribution from the auxiliary magnetic layer to the offset field along the first direction may thus be reduced, ideally to substantially zero, such that the sign of the offset fields at the free layer is flipped.

In some embodiments, the non-magnetic spacer layer is formed of Ta, Ir, Pt, Ru, CoFeX, CoX, FeX or CoFeBX, where X is a non-magnetic material such as W, Ta, or Mo. These materials may prevent the second tunnel barrier layer from modifying the charge distribution in the free layer, while allowing the desired magnetic anisotropy (e.g., PMA or IPMA) to be provided in the MTJ layer structure and the auxiliary magnetic layer structure.

In some embodiments, the auxiliary magnetic layer structure further comprises a spacer layer interposing the auxiliary magnetic layer and the second hard magnetic layer and configured to provide a parallel or antiparallel coupling of the magnetization of the auxiliary magnetic layer and the second hard magnetic layer. By coupling the magnetization of the auxiliary magnetic layer to the second hard magnetic layer, a pinned equilibrium magnetization state may be defined for the auxiliary magnetic layer. The auxiliary magnetic layer thus has a deterministic single final state regardless of whether the bias voltage is between the first and second threshold, or exceeds the first threshold.

The spacer layer may be configured to provide interlayer exchange coupling (IEC), also known as Ruderman-Kittel-Kasuya-Yosida (RKKY) exchange coupling. The coupling may thus be either parallel or antiparallel, as determined by the thickness of the spacer layer.

The program circuit of the MRAM device according to the second aspect may be configured to apply the first bias voltage and the second bias voltage as respective voltage pulses of substantially equal duration. As noted above, the final magnetization state of the free layer will in practice be determined by the amplitude of the applied voltage rather than the pulse duration. Hence, the durations of the first and second voltage pulses may be substantially equal. This may facilitate the writing protocol and enable the P and AP states to be programmed in approximately the same amount of time.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Example embodiments of memory stacks suitable for MRAM devices implementing VCMA-aided switching of the free layer magnetization will now be described with reference to the accompanying drawings. The memory stacks will be depicted in schematic cross-sections, wherein it is to be understood that the relative dimensions of some structures and layers may be exaggerated and not drawn to scale. Rather the dimensions may be adapted for illustrational clarity and to facilitate understanding. When present in the figures, the indicated axes X and Y consistently refer to a horizontal or in-plane direction, and a vertical direction transverse to X, respectively. As used herein, the terms "horizontal" and "in-plane" refer to directions parallel to a main plane of extension of the layers of the respective memory stacks, or equivalently (a main surface of) of a substrate supporting the memory stack of the MRAM device. Meanwhile, the term "vertical" refers to a normal direction to the plane of extension of the layers, or equivalently normal to (the main surface of) the substrate. The vertical direction Y accordingly corresponds to the direction along which the layers of the memory stacks are stacked. Furthermore, in the figures arrows are used to indicate magnetization states of relevant magnetic layers of the respective memory stacks. An arrow parallel or opposite to the Y direction signifies a perpendicular or out-of-plane magnetization state. An array parallel or opposite to the X direction signifies an in-plane magnetization state. Unless stated otherwise, a layer including a single arrow denotes a layer with a fixed or pinned magnetization. Meanwhile, a layer including two oppositely oriented arrows denotes a layer with a switchable magnetization state (typically a free layer).

Figure 1:
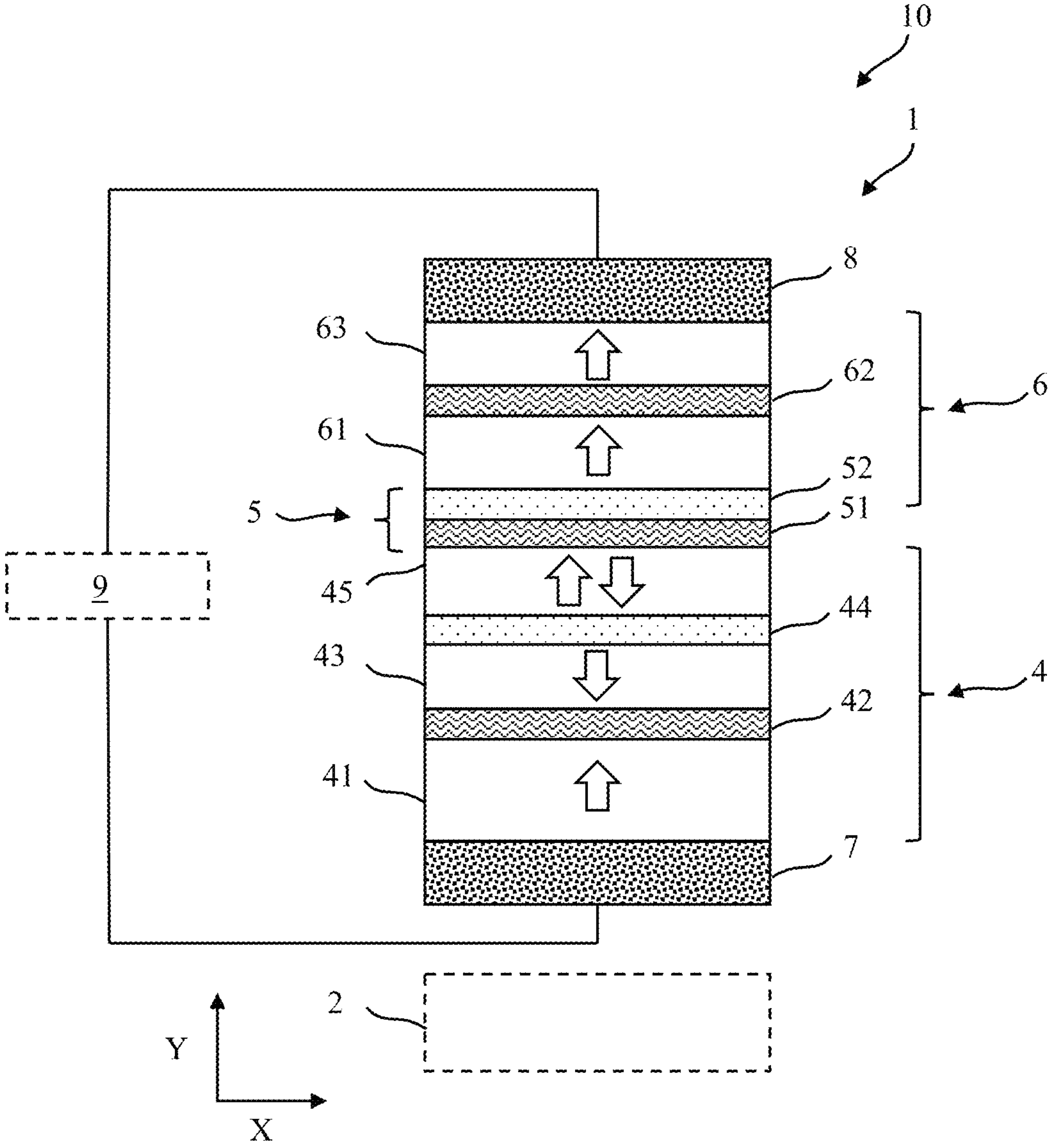
FIG. 1 schematically shows a memory stack and an MRAM device, according to an example.

FIG. 1 schematically shows an example embodiment of a memory stack 1 comprising an MTJ layer structure 4, an auxiliary magnetic layer structure 6, and an interposer layer structure 5 interposing the MTJ layer structure 4 and the auxiliary magnetic layer structure 6.

The MTJ layer structure 4 comprises a first hard magnetic layer (HL) 41, a reference layer (RL) 43, a free layer (FL) 45, and a first tunnel barrier layer or first barrier layer (BL) 44 interposing the RL 43 and the FL 45. The first BL layer 44 is configured to induce a VCMA in the FL 45, to enable a VCMA-aided switching approach described in detail below. The MTJ layer structure 4 may as shown further comprise a spacer layer (SL) 42 interposing the first HL 41 and the RL 43.

The auxiliary magnetic layer structure 6 comprises an auxiliary magnetic layer (i.e., the variable driver layer 61) and a second hard magnetic layer (i.e., the fixed driver layer 63). The auxiliary magnetic layer structure 6 may as shown further comprise a spacer layer 62 interposing the second hard magnetic layer (i.e., the fixed driver layer 63) and the auxiliary magnetic layer (i.e., the variable driver layer 61). For conciseness, the term driver layer (DL) structure will in the following be used to refer to the auxiliary magnetic layer structure 6. Correspondingly, the auxiliary magnetic layer and the second hard magnetic layer will be referred to as the "variable" DL layer (VDL) 61 and the "fixed" layer (FDL) 63, respectively. The term "driver layer" is motivated by the fact that the DL structure functionally may be seen as configured to "drive" the VCMA-aided switching of the FL 45, as described in detail below.

The interposer layer structure 5 interposes the FL 45 and the VDL 61. The interposer layer structure 5 comprises a second BL 52. The second BL 52 is configured to induce a VCMA in the VDL 61. The interposer layer structure 5 further comprises a non-magnetic SL 51 interposing the second BL 52 and the FL 45. Accordingly, the interposer layer structure 5 is arranged with the second BL 52 facing the VDL 61 of the DL structure (i.e., the auxiliary magnetic layer structure 6), and the non-magnetic SL 51 facing the FL 45 of the MTJ layer structure 4.

The memory stack 1 is as indicated in FIG. 1 configured to present PMA. That is, the magnetic layers of the memory stack 1 (HL 41, RL 43, FL 45, VDL 61 and FDL 63) are each configured as PMA-layers.

The RL 43 has a fixed or pinned magnetization state, pinned by the first HL 41. The first HL 41 is accordingly configured as a pinning layer of the MTJ layer structure 4. In the illustrated example, the first HL 41 and the RL 43 are configured as a synthetic anti-ferromagnetic (SAF) with oppositely oriented magnetization vectors coupled through the SL 42 providing an antiparallel coupling. However, this is merely an example and parallel coupling configurations are also possible. The type of coupling between the HL 41 and the RL 43 may be controlled via the thickness and composition of the SL 42.

The VDL 61 is configured to, in absence of any bias voltage across the memory stack 1, be maintained in a pinned magnetization state by the FDL 63 with a magnetization oriented along a first direction. The FDL 63 is accordingly configured as a pinning layer of the DL structure (i.e., the auxiliary magnetic layer structure 6). In the present disclosure, the first direction by convention corresponds to the orientation along which the magnetization vector of the FDL 63 is oriented when in the pinned magnetization state. In the illustrated example, the first direction corresponds to the vertical Y-direction. In the illustrated example, the VDL 61 and the FDL 63 are configured as a synthetic ferromagnetic (SFM) with substantially parallel magnetization vectors coupled through a SL 62 providing a parallel coupling. However, this is merely an example and anti-parallel coupling configurations are also possible where the VDL 61 and the FDL 63 are configured as a SAF. The type of coupling between the VDL 61 and the FDL 63 may be controlled via the thickness and composition of the SL 62.

The FL 45 has a variable magnetization switchable between a first magnetization state with a magnetization oriented along the first direction Y and a second magnetization state with a magnetization oriented along a second direction opposite the first direction, i.e. −Y (negative Y). Due to the PMA of the memory stack 1, the first and second directions Y and −Y define mutually opposite out-of-plane directions. For the depicted memory stack 1, the first magnetization state corresponds to an anti-parallel (AP) state of the MTJ layer structure 4 while the second magnetization state corresponds to a parallel (P) state of the MTJ layer structure 4. This follows from the opposite orientations of the respective pinned magnetization states of the RL 43 and the VDL 61.

Non-limiting examples of materials for the HL 41 and the FDL 63 include CoPt alloys of varying compositions, Co/Pt nano-laminates, CoPd alloys of varying compositions, Co/Pd nano-laminates, CoNi alloys of varying compositions, Co/Ni nano-laminates, FePt alloys of varying compositions, and Fe/Pt nano-laminates. The HL 41 and the FDL 63 may typically be formed with a thickness of about 10 nm or less.

Non-limiting examples of materials for the RL 43, the FL 45, and the VDL 61 include Fe-based and/or Co-based layers, for example, Fe, Co, FeB, CoB, CoFe, and CoFeB (of varying compositions of Co, Fe, and B). RL 43, the FL 45 and the VDL 61 may each typically be formed with a thickness of about 2 nm or less.

Non-limiting examples of materials for the first BL 44 and the second BL 52 include $MgO_x$, $AlO_x$, and $MgAlO_x$. The BL 44 and the BL 52 may typically be formed with a thickness of 5-20 angstroms (Å).

The purpose of the SL 51 interposing the second BL 52 and the FL 45 is to counteract or prevent the second BL 52 from inducing VCMA in the FL 45 at the side of the FL 45 facing the interposer layer structure 5. That is, VCMA at the side of the FL 45 facing the first BL 44 is desired, while VCMA at the opposite side of the FL 45 is to be limited. The SL 51 may accordingly be of a composition such that the SL 51 may act as a VCMA-breaking layer between the free layer 45 and the second BL 52. Non-limiting examples of materials of the SL 51 include Ta, Ir, Pt, Ru, or an alloy of CoFeX, CoX, FeX, or CoFeBX, where X is a non-magnetic material such as W, Ta, or Mo, or another conventional non-magnetic Boron getter. The amount of the non-magnetic material X may be varied. As may be appreciated, a greater amount of X implies a lower amount of the other components. The SL 51 may typically be formed with a thickness of about 2 nm or less.

Non-limiting examples of materials for the spacer layer SL 42 and the SL 62 include typical RKKY spacer materials, such as Cr, Ir, Ru, Ag, or RuAl, with a thickness chosen to achieve the desired coupling type (e.g. parallel or antiparallel). The thickness may typically be less than about 2 nm.

The memory stack 1 may as shown be arranged above a substrate 2. The substrate 2 may be any conventional substrate or wafer, such as a semiconductor substrate. Examples of semiconductor substrates include a Si substrate, a Ge substrate, a SiGe substrate, a SiC substrate, a SOI substrate, a GeOI substrate, or a SiGeOI substrate to name a few. Although not expressly shown in FIG. 2, the substrate 2 may support an active device portion or front-end-of-line (FEOL) portion including active devices. The memory stack 1 may more specifically be comprised in a back-end-of-line interconnect structure arranged on the substrate 2. The interconnect structure may comprise a stack of interconnect levels or metallization levels comprising interconnect structures (lines and vias) embedded in inter-layer dielectrics. The interconnect structures may for example couple the memory stack 1 to the program and read circuitry via bit and word lines. The interconnect structures may together with the active devices of the FEOL-portion define circuitry for controlling programming and reading operations, further discussed below. FIG. 1 illustrates in a schematic manner circuitry 9 which may apply programming and/or reading operations to the memory stack 1. The circuitry 9 may as shown be connected to the memory stack 1 via a bottom electrode (BE) 7 and a top electrode (TE) 8. The memory stack 1, the substrate 2, the interconnect structure and the circuitry 9 may be comprised in an MRAM device 10, where the memory stack 1 may be arranged in an array comprising a plurality of corresponding memory stacks.

In contrast to MTJ devices relying on the conventional precession-based VCMA-aided free layer magnetization state switching, the memory stack 1 is configured to enable a deterministic VCMA-aided switching. The determining switching is enabled by the VDL 61 of the DL structure (i.e., the auxiliary magnetic layer structure 6), which is used to modulate the offset field acting on the FL 45. As mentioned above, the VDL 61 is configured to, in absence of any bias voltage across the memory stack 1, be maintained in the pinned magnetization state by the FDL 63 with the magnetization oriented along the first direction Y.

In practice, the VDL 61 will remain in the pinned equilibrium magnetization state with the orientation along the first direction Y provided the energies contributing to the pinning exceed the demagnetizing energies $E_{demag}$ tending to bring the magnetization of the VDL 61 to an in-plane orientation.

Several magnetic energies contribute to the pinning of the magnetization state of the VDL 61, the main contributions being: $E_{couple}$—the coupling energy provided by the FDL 63 (which in the illustrated example is given by the RKKY coupling via the SL 62); and $E_k$—the magnetic anisotropy energy (PMA in the illustrated example). Assuming for simplicity there are no other contributions, the VDL 61 will thus remain in the equilibrium state provided $E_{couple}+E_k>E_{demag}$. By applying a voltage across the memory stack 1, an electric field will arise in the second BL 52 such that, in response, the magnetic anisotropy energy Ex may be modulated by the VCMA effect, where the modulation is given by:

$$E_k = E_{k0} * (1 - VCMA_{Coeff} * |E|),$$

where $E_{k0}$ is the magnetic anisotropy energy at zero bias, and $|E|=V_{bias}/t_{BL}$ is the magnitude of the electric field at the interface between the second BL 52 and the VDL 61, $V_{bias}$ is the voltage across the second BL 52, and $t_{BL}$ is the thickness of the second BL 52.

This means that, by applying a voltage exceeding some threshold voltage, which herein is denoted "first threshold voltage $V_{th\text{-}1\rightarrow 2}$," the VDL 61 may be destabilized from the pinned magnetization state (oriented along Y) and brought to a destabilized magnetization state corresponding to an in-plane magnetization state (oriented along X). The precise magnitude of the first threshold voltage will depend on among others $E_{couple}$, $E_{k0}$, $E_{demag}$, and $VCMA_{Coeff}$ which all are dependent on the design of the memory stack 1.

Bringing the VDL 61 to the destabilized in-plane magnetization state will further result in a modulation of the offset field acting on the FL 45. The offset field at the FL 45 is given by the net magnetostatic field produced by all magnetic layers of the memory stack 1 other than the FL 45, including the HL 41, the RL 43, the VDL 61, and the FDL 63. The VDL 61 may accordingly provide a first contribution to the offset field while remaining in the equilibrium magnetization state, and a second contribution to the offset field when brought to the destabilized magnetization state.

The memory stack 1, and in particular the VDL 61, are configured so that the first contribution, together with the contributions from the other magnetic layers of the memory stack 1, result in an offset field oriented along the first direction Y at the FL 45, while the second contribution, together with the contributions from the other magnetic layers of the memory stack 1 (which will remain substantially unchanged), result in an offset field oriented along the second direction at the FL 45. Accordingly, in summary, by applying a first bias voltage exceeding the first threshold voltage across the memory stack 1, the VDL 61 may be brought from the equilibrium magnetization state (out-of-plane, along the Y direction) to the destabilized magnetization state (in-plane, along the X direction), and thus cause a sign change of the Y-component of the offset field at the FL 45.

The memory stack 1 is further configured so that the first threshold voltage for bringing the VDL 61 to the destabilized magnetization state is greater than a threshold voltage for causing VCMA-inducted switching of the FL 45 from the second magnetization state (in the illustrated example P, wherein the FL magnetization is oriented along the −Y direction) to the first magnetization state (in the illustrated example AP, wherein the FL magnetization is oriented along the Y direction), herein termed "second threshold voltage, $V_{th\text{-}2\rightarrow 1}$."

Accordingly, the memory stack 1 provides a first write window $V_{th\text{-}2\rightarrow 1}<V<V_{th\text{-}1\rightarrow 2}$ for setting the FL 45 to the first magnetization state (e.g. AP) and a second write window $V>V_{th\text{-}1\rightarrow 2}$ for setting the FL 45 to the second magnetization state (e.g. P).

A second threshold voltage $V_{th\text{-}2\rightarrow 1}$ smaller than a first threshold voltage $V_{th\text{-}2\rightarrow 1}$ may be achieved by different techniques. As a first example, the VDL 61 may be configured to present a stronger magnetic anisotropy (e.g. PMA) than the FL 45. As a second example, the VCMA coefficient for the VDL 61 may be smaller than the VCMA coefficient for the FL 45. Combinations of these techniques are also possible.

Figure 2A:
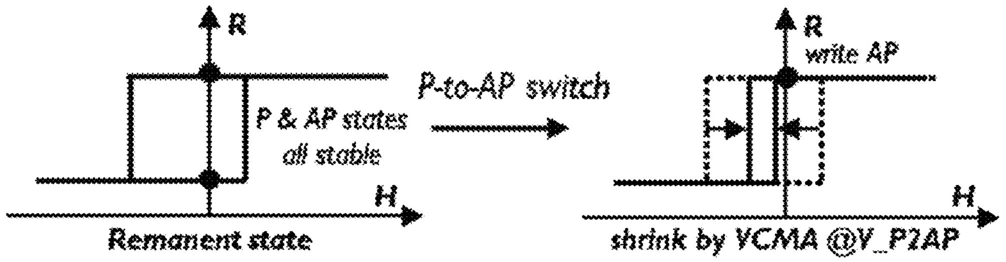
FIG. 2*a* shows free layer switching from a P-state to an AP-state for the memory stack of FIG. 1, according to an example.
Figure 2B:
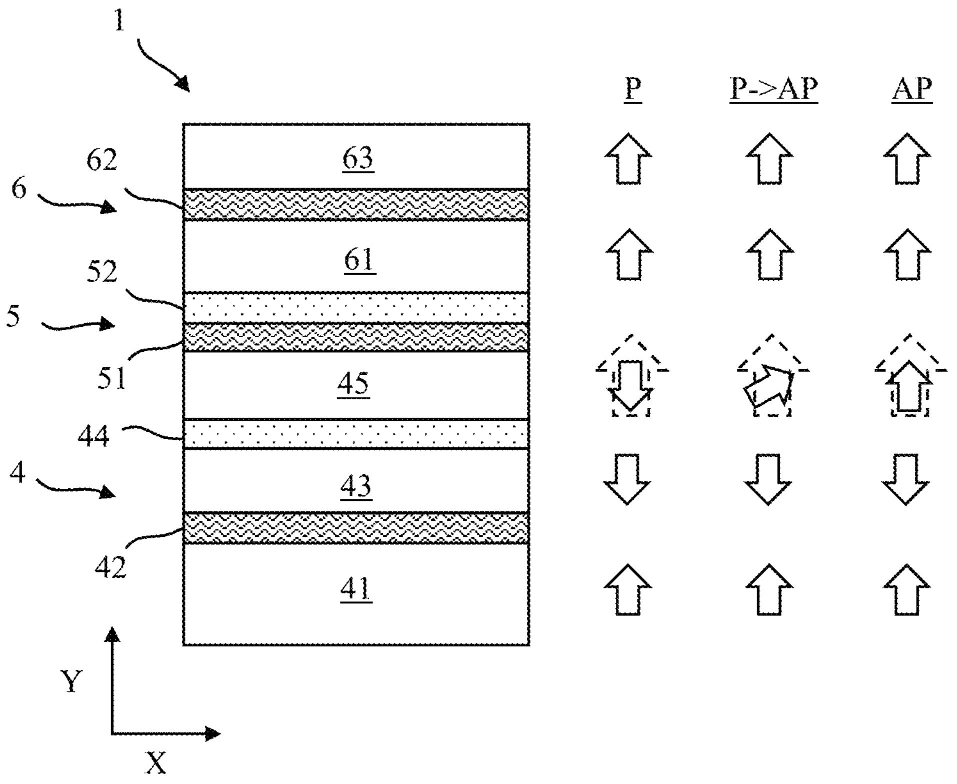
FIG. 2*b* shows free layer switching from a P-state to an AP-state for the memory stack of FIG. 1, according to an example.
Figure 3A:
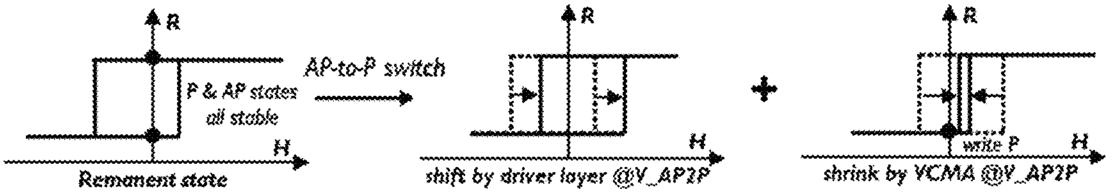
FIG. 3*a* shows free layer switching from an AP-state to a P-state for the memory stack of FIG. 1, according to an example.
Figure 3B:
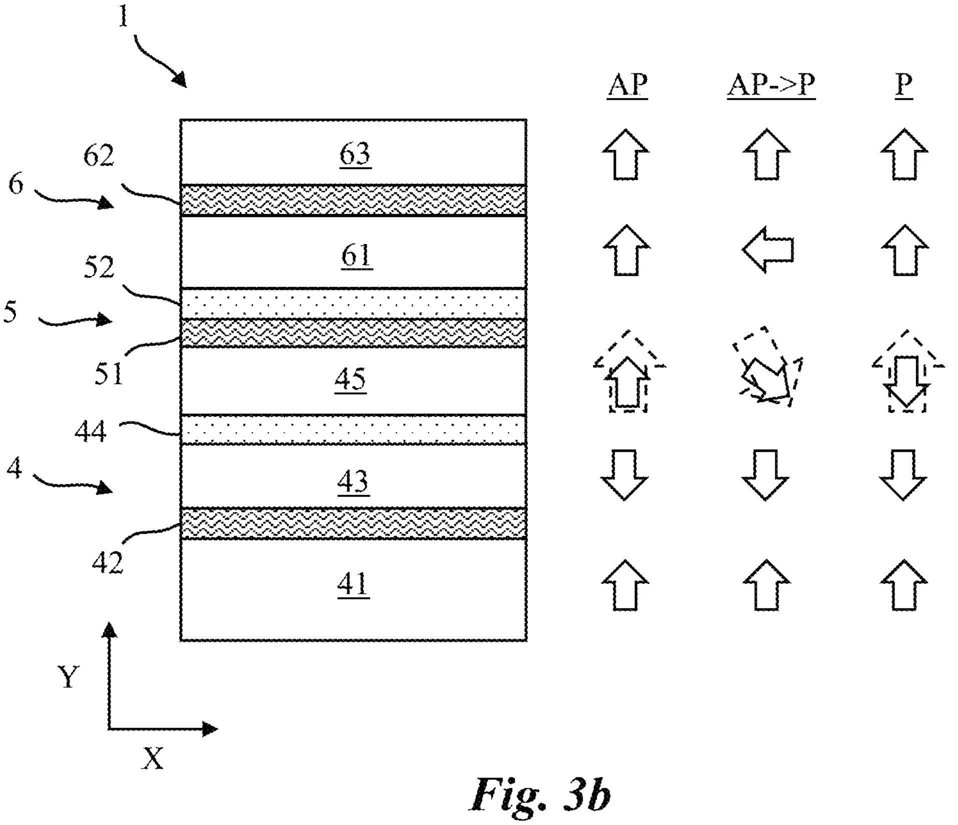
FIG. 3*b* shows free layer switching from an AP-state to a P-state for the memory stack of FIG. 1, according to an example.

FIG. 2*a*, FIG. 2*b*, FIG. 3*a*, and FIG. 3*b* summarize the above discussion by means of schematic illustrations. FIG. 2*b* and FIG. 3*b* each show the memory stack 1, however for simplicity omitting the substrate 2 and the BE 7 and TE 8.

FIG. 2*a* and FIG. 2*b* depict switching from the first magnetization state P to the second magnetization state AP. The graph on the left-hand side of FIG. 2*a* shows the remanent and equally stable magnetization states P and AP of the FL 45 in absence of a bias voltage V across the memory stack 1. The graph on the right-hand side of FIG. 2*a* shows the narrowing of the hysteresis curve as a result of the VCMA-effect induced in the FL 45 in response to a second bias voltage $V_2$ within the first write windows $V_{th\text{-}2\rightarrow 1}<V_2<V_{th\text{-}1\rightarrow 2}$, applied as a voltage pulse.

FIG. 2*b* shows the magnetization states of the magnetic layers of the memory stack 1 in respective rows aligned with the respective layers for each one of: the initial first magnetization state (column P); while the second bias voltage $V_2$ is applied (column P→AP); and after the second bias voltage $V_2$ has been removed (column AP). The arrow with the dashed outline overlying the arrow representing the magnetization of the FL 45 schematically indicates the orientation of the offset field at the FL 45.

Since the second bias voltage $V_2$ is within the first write window, and hence exceeds the second threshold voltage $V_{th\text{-}2\rightarrow 1}$ but is less than the first threshold voltage $V_{th\text{-}1\rightarrow 2}$, the VDL 61 remains in the pinned magnetization state and consequently the sign of the Y-component of the offset field is unchanged, and thus tilts the magnetization of the FL 45, modulated by the VCMA-effect, towards the first magnetization state AP which thus becomes the final state of the FL 45 after the second bias voltage $V_1$ is removed.

FIG. 3*a* and FIG. 3*b* in a corresponding manner illustrate switching from the second magnetization state AP to the first magnetization state P.

The graph on the left-hand side of FIG. 3*a* is in substance identical to FIG. 2*a*. The center graph of FIG. 3*a* illustrates the shifting of the hysteresis curve inducted by the switching of the VDL 61 from the pinned equilibrium state to the destabilized magnetization state and the entailing modulation of the offset field at the FL 45, triggered by a first bias voltage $V_1$ exceeding the first threshold voltage $V_1>V_{th\text{-}1\rightarrow 2}$, applied as a voltage pulse. The graph on the right-hand further shows the narrowing of the hysteresis curve as a result of the VCMA-effect induced in the FL 45 in response to $V_1$.

FIG. 3*b* shows the magnetization states of the magnetic layers of the memory stack 1 in respective rows aligned with the respective layers for each one of: the initial second magnetization state (column AP); while the first bias voltage $V_1$ is applied (column AP→P); and after the first bias voltage $V_1$ has been removed (column P). Again, the arrow with the dashed outline overlying the arrow representing the magnetization of the FL 45 schematically indicates the orientation of the offset field at the FL 45.

Since the first bias voltage $V_1$ exceeds $V_{th\text{-}1\rightarrow 2}$, (and hence also $V_{th\text{-}2\rightarrow 1}$), the VDL 61 is brought to the destabilized magnetization state with the in-plane orientation, the sign of the Y-component of the offset field is flipped, and thus the magnetization of the FL 45, modulated by the VCMA-effect, is tilted towards the second magnetization state P which thus becomes the final state of the FL 45 after the first bias voltage $V_1$ is removed.

With reference again to FIG. 1, the first and second bias voltages $V_1$ may be applied to the memory stack 1 by a program circuit of the circuitry 9 of the MRAM device 10. Accordingly, the program circuit may set the FL 45 to the first magnetization state (AP) by applying the second bias voltage $V_2$ within the first write windows $V_{th\text{-}2\rightarrow 1}<V_2<V_{th\text{-}1\rightarrow 2}$ to the memory stack 1. Conversely, the program circuit may set the FL 45 to the second magnetization state by applying the first bias voltage $V_1$ that exceeds $V_{th\text{-}1\rightarrow 2}$ to the memory stack 1. The first and second bias voltages $V_1$ and $V_2$ may be applied as respective voltage pulses. Due to the deterministic switching enabled by the memory stack 1, the durations of the first and second voltage pulses $V_1$ and $V_2$ may be substantially equal, so that the P and AP states may be programmed in approximately the same amount time. For the same reasons, the relative durations of the first and second voltage pulses $V_1$ and $V_2$ are not critical and different durations may also be used, e.g. to achieve other optimization objectives such as fine-tuning write performance as one non-limiting example.

For the memory stack 1 and MRAM device 10 presented above, the first direction along which the magnetization vector of the FDL 63 is oriented when in the pinned magnetization state corresponds to the vertical Y-direction, i.e. away from the MTJ layer structure 4. As orientation of the magnetization vector of the RL 43 is opposite the first direction, it follows that the threshold voltage for switching the FL 45 from P to AP (i.e. the second threshold voltage $V_{th\text{-}2\rightarrow 1}$) is less than the threshold voltage for switching the FL 45 from AP to P (i.e. the first threshold voltage $V_{th\text{-}1\rightarrow 2}$).

Figure 4A:
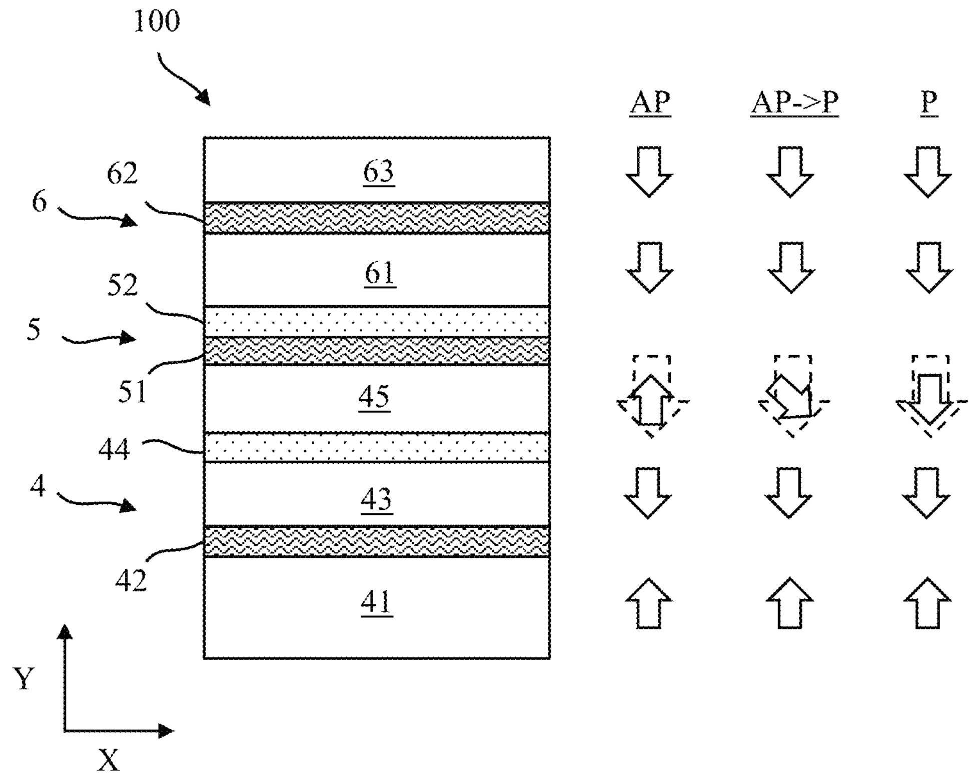
FIG. 4*a* shows free layer switching between the AP-state and the P-state for a memory stack according to an example.
Figure 4B:
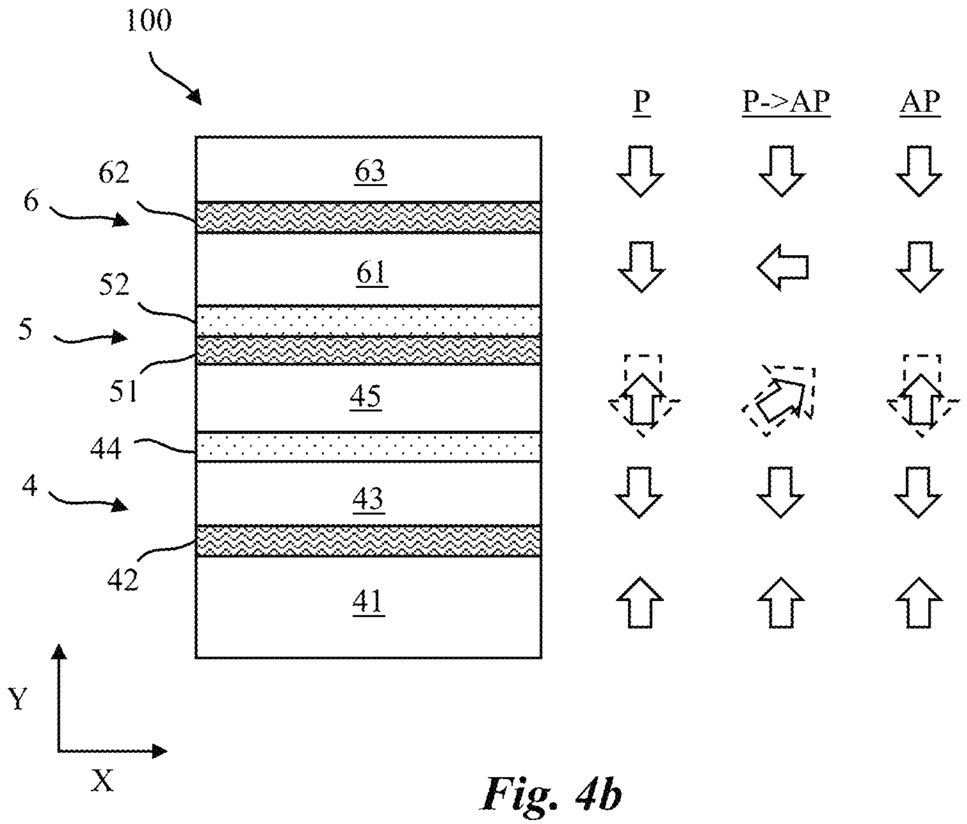
FIG. 4*b* shows free layer switching between the AP-state and the P-state for a memory stack according to an example.

FIG. 4*a* and FIG. 4*b* show a memory stack 100 corresponding to the memory stack 1 but designed such that the magnetization vectors of the VDL 61 instead is oriented along the negative Y-direction when in the pinned magnetization state. That is, the first direction is in the negative Y-direction, towards the MTJ layer structure 4. Since the orientation of the magnetization vector of the RL 43 is the same as in the memory stack 1, it follows that the threshold voltage for switching the FL 45 from AP to P (i.e. the second threshold voltage $V_{th\text{-}2\rightarrow 1}$) as shown in FIG. 4*a* is less than the threshold voltage for switching the FL 45 from P to AP (i.e. the first threshold voltage $V_{th\text{-}1\rightarrow 2}$) as shown in FIG. 4*b*.

The present disclosure by no means is limited to the embodiments described above. On the contrary, many modifications and variations are possible. For example, the memory stacks 1 and the memory stack 100 with PMA have been shown. The present disclosure may be applied also to a memory stack wherein the magnetic layers (the HL, the RL, the FL, the VDL, and the FDL) present IPMA. The above description applies correspondingly to such a configuration, with the difference that the VDL in the pinned equilibrium magnetization state has an in-plane magnetization and in the destabilized magnetization state has an out-of-plane magnetization. Accordingly, the VCMA-effect in the VDL will be used to modulate the offset field such that the in-plane component (e.g. the X-component) of the offset field at the FL changes sign.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A memory stack comprising:

a magnetic tunnel junction (MTJ) layer structure comprising:

a first hard magnetic layer;

a reference layer with a magnetization state pinned by the first hard magnetic layer;

a free layer switchable between a first magnetization state with a first magnetization oriented along a first direction and a second magnetization state with a second magnetization oriented along a second direction opposite the first direction; and a first barrier layer interposing the reference layer and the free layer and configured to induce a first VCMA in the free layer;

an auxiliary magnetic layer structure comprising a second hard magnetic layer and an auxiliary magnetic layer; and an interposer layer structure interposing the free layer of the MTJ layer structure and the auxiliary magnetic layer of the auxiliary magnetic layer structure, the interposer layer structure comprising:

a second barrier layer configured to induce a second VCMA in the auxiliary magnetic layer; and a non-magnetic spacer layer interposing the second barrier layer and the free layer;

wherein, in absence of a bias voltage across the memory stack, a magnetization state of the auxiliary magnetic layer is pinned by the second hard magnetic layer in a pinned magnetization state with a magnetization oriented along the first direction, wherein, in response to a first bias voltage exceeding a first threshold voltage across the memory stack, the second VCMA induced in the auxiliary magnetic layer causes the auxiliary magnetic layer to be destabilized from the pinned magnetization state and brought to a destabilized magnetization state, wherein the free layer is arranged in an offset field generated by the memory stack and wherein the auxiliary magnetic layer is configured to:

when the auxiliary magnetic layer is in the pinned magnetization state, provide a first contribution to the offset field such that the offset field is oriented along the first direction at the free layer, and when the auxiliary magnetic layer is in the destabilized magnetization state, provide a second contribution to the offset field such that the offset field is oriented along the second direction at the free layer, and wherein the first threshold voltage exceeds a second threshold voltage for causing VCMA-induced switching of the free layer from the second magnetization state to the first magnetization state.

2. The memory stack according to claim 1, wherein the destabilized magnetization state of the auxiliary magnetic layer corresponds to a magnetization of the auxiliary magnetic layer being oriented transverse to the first direction.

3. The memory stack according to claim 1, wherein the non-magnetic spacer layer is formed of Ta, Ir, Pt, Ru, CoFeX, CoX, FeX or CoFeBX, wherein X is a non-magnetic material including W, Ta or Mo.

4. The memory stack according to claim 3, wherein the non-magnetic spacer layer is formed of Ta.

5. The memory stack according to claim 3, wherein the non-magnetic spacer layer is formed of Ir.

6. The memory stack according to claim 3, wherein the non-magnetic spacer layer is formed of Pt.

7. The memory stack according to claim 3, wherein the non-magnetic spacer layer is formed of Ru.

8. The memory stack according to claim 3, wherein the non-magnetic spacer layer is formed of CoFeX.

9. The memory stack according to claim 3, wherein the non-magnetic spacer layer is formed of CoX.

10. The memory stack according to claim 3, wherein the non-magnetic spacer layer is formed of FeX.

11. The memory stack according to claim 3, wherein the non-magnetic spacer layer is formed of CoFeBX.

12. The memory stack according to claim 3, wherein the non-magnetic material includes W.

13. The memory stack according to claim 3, wherein the non-magnetic material includes Ta.

14. The memory stack according to claim 3, wherein the non-magnetic material includes Mo.

15. The memory stack according to claim 1, wherein the auxiliary magnetic layer structure further comprises a spacer layer interposing the auxiliary magnetic layer and the second hard magnetic layer and configured to provide a parallel or antiparallel coupling of the magnetization of the auxiliary magnetic layer and the second hard magnetic layer.

16. The memory stack according to claim 1, wherein the first hard magnetic layer, the reference layer, the free layer, the auxiliary magnetic layer, and the second hard magnetic layer each are layers with perpendicular magnetic anisotropy, and wherein the first direction and the second direction are mutually opposite out-of-plane directions.

17. The memory stack according to claim 1, wherein a first VCMA-coefficient of the auxiliary magnetic layer is smaller than a second VCMA-coefficient of the free layer, or wherein the auxiliary magnetic layer has a stronger magnetic anisotropy than the free layer.

18. An MRAM device comprising the memory stack according to claim 1, and further comprising a program circuit configured to apply the first bias voltage to set the free layer to the second magnetization state, and to apply a second bias voltage between the first threshold voltage and the second threshold voltage to set the free layer to the first magnetization state.

19. The MRAM device according to claim 18, wherein the first bias voltage and the second bias voltage are configured to be applied as respective voltage pulses of substantially equal duration.

20. A method for programming the memory stack of the MRAM device according to claim 18, the method comprising:

setting the free layer to the first magnetization state by applying a bias voltage between the first threshold voltage and the second threshold voltage to the memory stack; or setting the free layer to the second magnetization state by applying a bias voltage exceeding the first threshold voltage to the memory stack.

* * * * *